Figure 1:
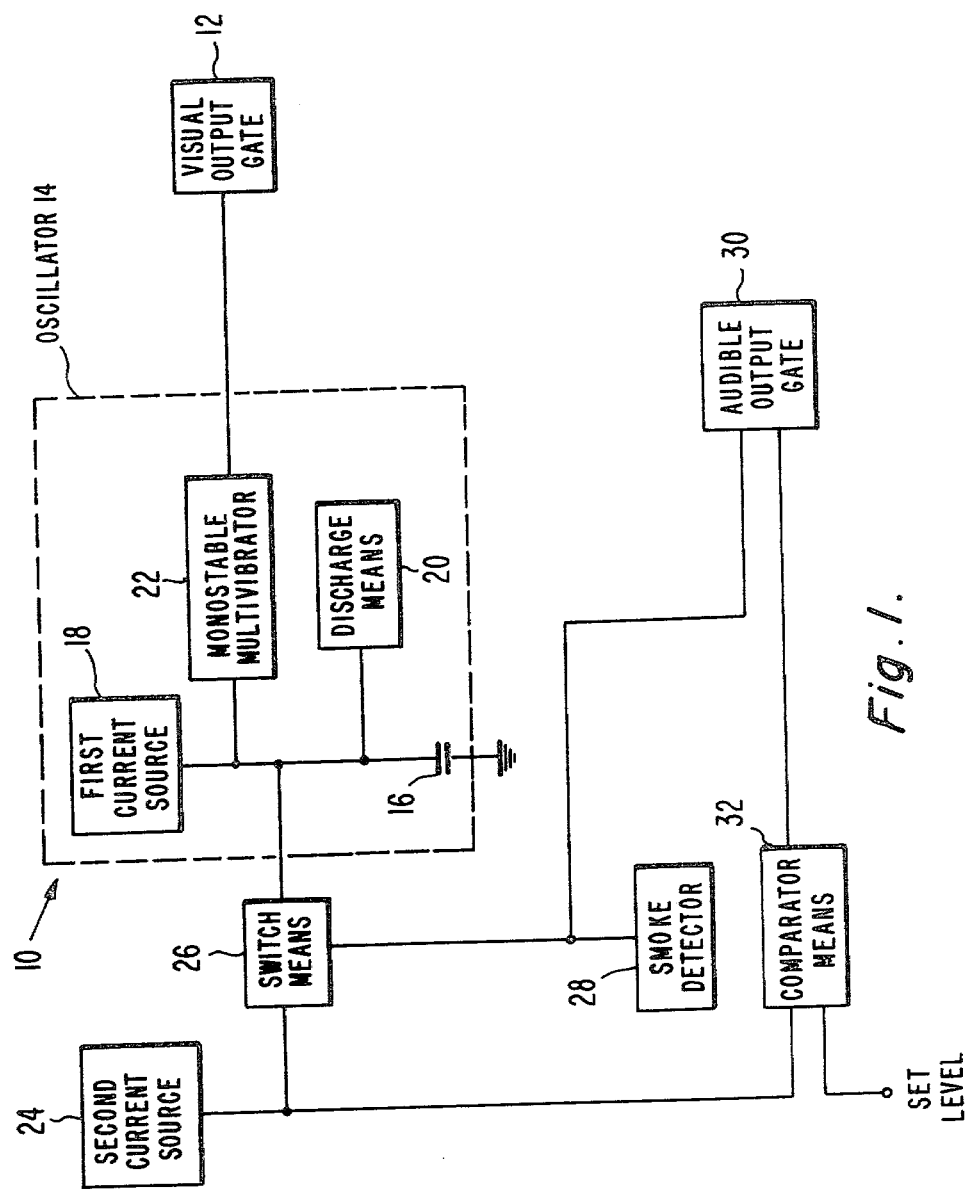

United States Patent [19]

Schade, Jr.

[11] 4,250,464
[45] Feb. 10, 1981

[54] MULTI-MODE RELAXATION OSCILLATOR

[75] Inventor: Otto H. Schade, Jr., N. Caldwell, N.J.

[73] Assignee: RCA Corporation, New York, N.Y.

[21] Appl. No.: 921,268

[22] Filed: Jul. 3, 1978

[51] Int. Cl.³ .................. G08B 19/00; G08B 23/00; H03K 3/02
[52] U.S. Cl. ........................... 331/65; 331/111; 331/143; 340/521
[58] Field of Search ............ 331/65, 66, 111, 143, 331/150, 179; 340/521, 522

[56] References Cited

U.S. PATENT DOCUMENTS

| | | | |
|---|---|---|---|
| 3,487,404 | 12/1969 | Midkiff | 340/521 |
| 3,559,098 | 1/1971 | Chandos | 331/111 |
| 3,566,301 | 2/1971 | Grangaard, Jr. | 331/113 |
| 3,694,672 | 9/1972 | Buyak | 307/293 |
| 3,824,484 | 7/1974 | Gillette | 331/179 X |
| 3,886,485 | 5/1975 | Takahashi | 331/111 |
| 3,986,143 | 10/1976 | Nutz | 331/111 |
| 4,147,996 | 3/1979 | Gontowski, Jr. | 331/111 |

*Primary Examiner*—Siegfried H. Grimm
*Assistant Examiner*—Edward P. Westin
*Attorney, Agent, or Firm*—E. M. Whitacre; P. J. Rasmussen; J. M. O'Meara

[57] ABSTRACT

In a relaxation oscillator where the oscillation frequency is proportional to the charge rate of a capacitor, independent current sources are connected through separate switches to change the charge rate of the capacitor and thus the oscillation frequency. Each switch is controlled by signals from a separate detector of a condition which requires that the oscillation frequency be changed. An oscillation frequency increase between the standby and alarm modes of a smoke detector is accomplished in one disclosed embodiment and duty cycle means for controlling the operative period of the alarm indicator during each cycle of the increased oscillator frequency is disclosed in a more particular embodiment.

12 Claims, 2 Drawing Figures

MULTI-MODE RELAXATION OSCILLATOR

The present invention relates to a multi-mode oscillator and especially such an oscillator which provides an ON/OFF duty cycle during each oscillation period in at least one mode of operation. Although oscillators of variable frequency are well-known in the art, multi-mode oscillators having distinct frequencies for separate modes of operation are uncommon and those that are known in the art tend to be relatively complex in design and costly by comparison with the multi-mode oscillator of this invention. However, many applications do exist for multimode oscillators, such as in modern smoke detectors where pulsating indications at different frequencies are required during the standby and alarm modes of operation. Furthermore, some smoke detector applications require that a duty cycle signal be utilized to activate an audible indicator during each period of the frequency for the alarm mode, such as where the audible indicator is a piezoelectric horn.

A relaxation oscillator of the type which derives its oscillation frequency from the charge rate of a capacitor is modified in the present invention to selectively produce one of at least two oscillation frequencies. At least one additional current source is independently connected through a mode control switch to selectively change the oscillation frequency by changing the charge rate of the capacitor. Each mode control switch includes a control electrode that is connected to the output of a condition detector which generates a signal when a change in frequency is required.

In one embodiment, an ON/OFF duty cycle during each oscillation period of at least one mode is accomplished with a differential amplifier that compares the voltage across (or the charge level on) the capacitor against a voltage set level and when the former level exceeds the latter level, produces a signal at one input of a gate through which the mode output is controlled.

Figure 2:
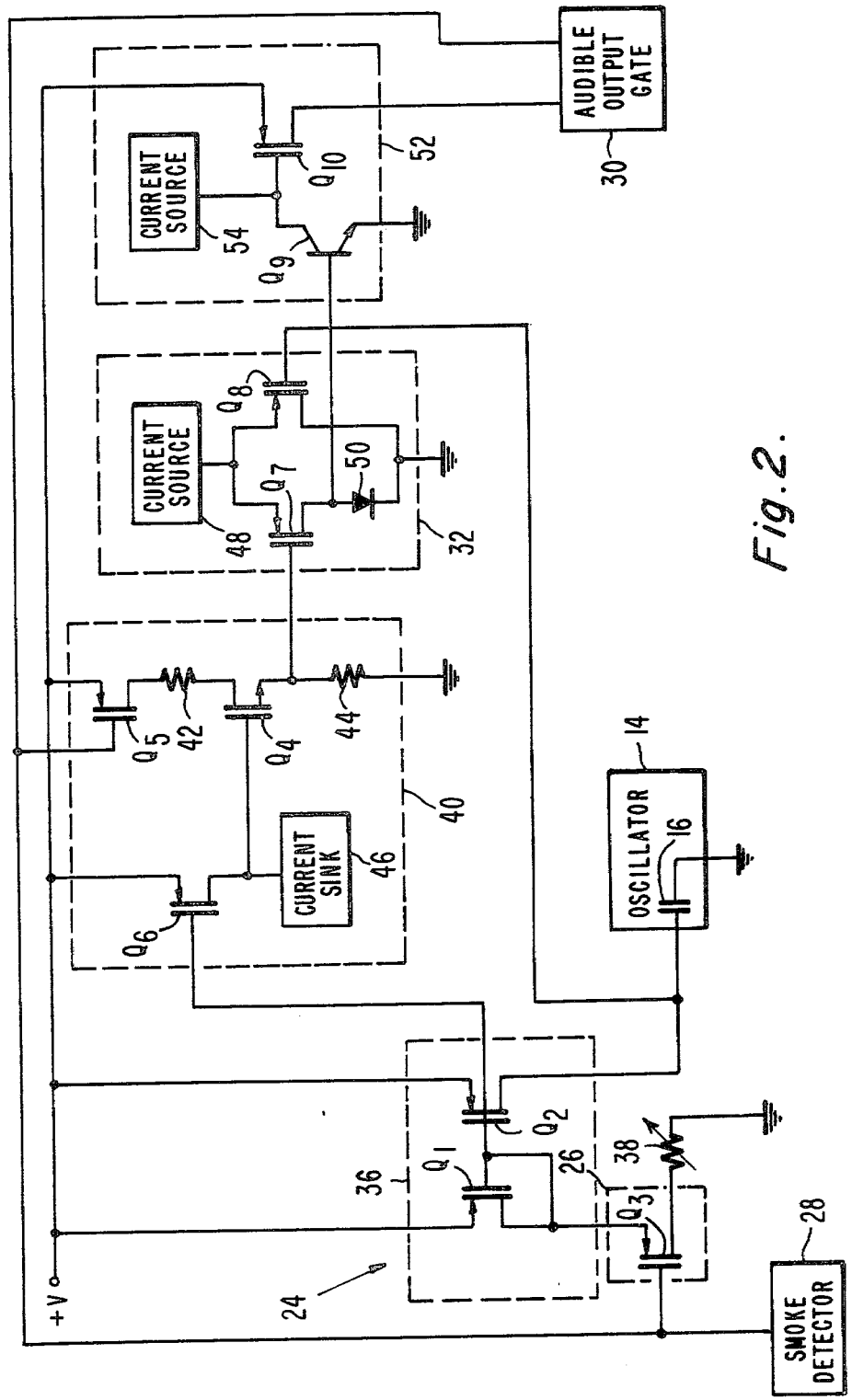

In the drawings:

FIG. 1 is a block diagram for the multi-mode oscillator of this invention as embodied in a particular smoke detector to provide distinct frequencies during separate modes of pulsating indications; and FIG. 2 is a schematic diagram of an alternative arrangement wherein the FIG. 1 block elements that relate to the multi-mode oscillator of this invention are further defined for the preferred embodiments thereof.

Turning now to the drawings, the multi-mode oscillator of this invention is incorporated into the FIG. 1 block diagram of a fire alarm system 10 which operates to provide a pulsating visual indication at a first frequency during the standby mode and a pulsating audible indication at a second frequency during the alarm mode. The pulsating visual indication is provided conventionally by a light-emitting diode (not shown in FIG. 1) through a visual output gate 12 which is enabled by an oscillator 14 at a frequency of approximately one cycle per minute. To avoid the use of a very large capacitor in accomplishing this rather low frequency, the oscillator 14 is of the relaxation type wherein frequency of oscillator 14 is proportional to the charge rate of a capacitor 16 which is charged by a first current source 18 of relatively low magnitude. A discharge means 20 such as a bistable switch of the type utilized in U.S. Pat. No. 4,001,723, allows the capacitor 16 to charge up to a given level at which a discharge path is established and the charge is reduced to a lower level from which the capacitor 16 is again charged to start a repeat of the charge/discharge cycle. The charge level on the capacitor 16 is also applied to the input of a monostable multivibrator 22 which fires to enable the visual output gate 12 when the charge level reaches some intermediate magnitude during each cycle of the oscillator 14.

A self-interrupting horn of a mechanical type has generally been utilized in prior art fire alarm systems to provide the pulsating audible indication. However, loudspeakers and piezoelectric horns having superior efficiency and reliability relative to the self-interrupting horn are coming into use for this purpose. Pulsating inputs are required by both of these devices and the piezoelectric horn has been found to be more compelling as an alarm when actuated by a duty cycle of 80 percent ON and 20 percent OFF during each cycle of the alarm mode frequency having a one-half second period. As used herein, duty cycle is the ratio of pulse width to the interval between like portions of successive pulses, usually expressed as a percent. Although it is generally believed by designers of fire alarm systems that at least a second timing capacitor, if not a second oscillator, is needed to provide the distinct frequencies required for operation of the visual and audible indicators, the oscillator 14 shown in the fire alarm system 10 of FIG. 1 can be modified to have multiple frequency modes for this purpose. In this multi-mode oscillator, a second source 24 of current is connected to the capacitor 16 through a switch means 26 for controlling current flow. Control of the switch means 26 is accomplished through an electrode at which a signal is applied from a smoke detector 28 whenever an alarm condition exists.

The capacitor 16 is only charged by current from the first source 18 when the switch means 26 interrupts current flow thereto from the second source 24 but is charged by current flow from both the first and second sources 18 and 24 when the switch means 26 is conductive. Consequently, the oscillator 14 will operate at two distinctly different frequencies depending on the output signal condition of the smoke detector 28. Of course, the charge rate of the capacitor 16 will be greater when the switch means 26 is rendered conductive by the signal from the smoke detector 28 and therefore, the frequency of the oscillator 14 will be higher for this condition.

The output from the oscillator 14 can be applied in many ways to drive the audible transducer with the simplest way being merely to apply the output from the monostable multivibrator 22 thereto through a logic gate. Such an arrangement would be quite suitable where the audible transducer is a loudspeaker. However, where the audible transducer is a piezoelectric horn it is desirable to utilize a duty cycle control means for controlling the operative period of the horn during each frequency cycle of the oscillator 14. One convenient arrangement for providing this duty cycle means with the multi-mode oscillator arrangement discussed above is shown in FIG. 1 where the charge level on capacitor 16 is applied through the switch means 26 to one input of a voltage comparator means 32 and a delay time voltage set level is applied at the other input thereof. The output signal from the comparator means 32 is applied to one input of an audible output gate 30 which in this particular embodiment is an AND gate having the alarm signal from the smoke detector 28 applied to the other input thereof.

Because the charge level of capacitor 16 will be blocked from the input of the comparator means 32 when no signal is applied by the smoke detector 28 to the control electrode of the switch means 26, the delay time set level on the other input of the comparator means 32 will then determine the output level thereof. This output level may enable its input to the audible output gate 30, as will be explained later in this description regarding a specific embodiment of the invention. However, regardless of this output level, the audible transducer will not be activated and no indication of an alarm condition will be given, so long as the other input to the gate 30 is not enabled by the smoke detector 28.

When the alarm signal is applied by the smoke detector 28 to the control electrode of switch means 26, the charge level of capacitor 16 is applied to the input of the comparator means 32. Thereafter, when the charge level of capacitor 16 exceeds the delay time set level during each oscillator cycle, the output level of comparator means 32 enables its input to the audible output gate 30 for the remainder of the oscillator cycle. Since the other input of gate 30 is also enabled by the alarm signal from the smoke detector 28, gate 30 will activate the audible transducer during this remainder of the oscillator cycle. Of course, this activation of the audible transducer through the gate 30 will reoccur for each frequency cycle of the multi-mode oscillator 14 for as long as the smoke detector 28 applies the alarm signal to the switch means 26. Furthermore, the duty cycle of such activation is established by the portion of each frequency cycle of the oscillator 14 during which the charge level on capacitor 16 exceeds the delay-time voltage set level. Comparator means 32 applies its output signal to an input of gate 30 whenever the voltage on capacitor 16 exceeds the delay-time voltage set level. Thus, the duty cycle of the activation can be readily varied by changing the delay-time voltage set level.

Those skilled in the art will realize without further explanation that the multi-mode oscillator of this invention could have any number of frequency modes, even though only two such frequency modes are utilized in the fire alarm system 10 of FIG. 1. Furthermore, a particular duty cycle can be associated with each frequency mode utilized. Each such frequency mode would of course require its own current source 24', switch means 26', and condition indicator 28', while each duty cycle control means would require its own voltage comparator means 32' and indication output gate 30'.

Although many embodiments of the invention are possible in regard to both the multi-mode oscillator and the duty cycle aspects thereof, integrated circuitry for the preferred embodiments thereof is illustrated in FIG. 2 where only the capacitor 16 is shown within the relaxation oscillator 14. The second source 24 of current is a current mirror amplifier 36 which includes a master path (input circuit) and a slave path (output circuit). FET transistors Q1 and Q2 are connected in the master and slave paths respectively with one side of the drain-source conduction path in each transistor being commonly connected to a D.C. voltage source +V. The gate electrodes of both Q1 and Q2 are commonly connected to the other side of the drain-source conduction path in Q1, while the other side of the drain-source conduction path in Q2 is connected to charge the capacitor 16. An FET transistor Q3 is connected as the switch means 26 with one side of its drain-source conduction path connected to the commonly connected gates of Q1 and Q2 and the other side of its drain-source conductive path connected to ground through a resistor 38. The alarm signal from smoke detector 28 is applied to the gate electrode of Q3.

Because p-channel enhancement-type MOS/FET transistors are utilized in the FIG. 2 circuitry, current flow through the main conduction path of Q3 is normally cut off by zero or positive output from the smoke detector 28 which must therefore produce a low level or negative signal when an alarm condition exists to render Q3 and the switch means 26 conductive. The current mirror amplifier 36 becomes operative when the switch means 26 is conductive to forward-bias the commonly connected gates of Q1 and Q2 with respect to their sources and this renders these transistors conductive. In current mirror amplifier 36, the current flow through Q1 and Q2 is directly proportional to the forward-bias voltage that is imposed between their gate and source electrodes. Since this forward bias voltage is complementary to that of the voltage drop across the resistor 38, the magnitude of current flowing in the slave path of the current mirror amplifier 36 is precisely controlled in inverse proportion to the value of the resistor 38, neglecting the voltage drop across Q1 and Q3. Therefore, a constant current will flow through Q2 to increase the charge rate of capacitor 16 and thereby change the frequency of oscillator 14 whenever the smoke detector 28 applies a low-level signal to the gate of Q3.

Resistor 38 could be included as part of the integrated circuitry, or it may be a discrete component that is externally connected to the integrated circuit. As an externally connected component furthermore, the resistor 38 could be a variable resistor to provide for frequency adjustment of the oscillator 14. Although the FIG. 2 circuitry for the second source 24 produces a constant current, circuitry producing a varying current could be utilized where, for example, the oscillator 14 is to sweep a frequency range in providing a warbling audible alarm. Furthermore, bipolar transistors could be utilized in the current mirror amplifier 36 rather than the MOS/FET transistors that are shown in FIG. 2.

The delay time set level is derived from a network 40 in the FIG. 2 embodiment of the duty cycle control means. In network 40, resistors 42 and 44 are series-connected through the drain-source conduction path of an FET transistor Q4 as a voltage divider, which voltage divider is connected between the voltage source +V and ground through the drain-source conduction path of an FET transistor $Q_5$. The alarm signal from the smoke detector 28 is applied to the gate electrode of $Q_5$, while the gate electrode of $Q_4$ is connected to the interconnection between a current sink 46 and one side of the drain-source conduction path in an FET transistor $Q_6$. The other side of the drain-source conduction path in $Q_6$ is connected to the voltage source +V, while the gate electrode thereof is connected to the commonly connected gate electrodes of $Q_1$ and $Q_2$.

The output of the voltage divider between resistors 42 and 44 is connected to the comparator means 32 as the delay time set level. This output is substantially at ground level except when the alarm signal from the smoke detector 28 renders $Q_4$ and $Q_5$ conductive simultaneously to establish a positive level output. As discussed previously, this alarm signal and the voltage source +V are of complementary levels and therefore, simultaneous conduction through $Q_4$ and $Q_5$ requires that these transistors be of complementary types. However, those skilled in the art will understand without further explanation that other circuit arrangements of network 40 and/or the second current source 24 are possible wherein Q4 and Q5 are of the same type while also being simultaneously conductive.

Within the duty cycle means, the comparator means 32 includes FET transistors Q7 and Q8 which are arranged as a differential amplifier with one side of the drain-source conduction path in each transistor commonly connected to a current source 48. The other sides of the drain-source conduction paths in Q7 and Q8 are both connected to ground, with the connection from Q7 being made through a diode 50 which is poled to conduct current from the source 48 to ground. The gate electrodes of Q7 and Q8 are connected to receive the delay time set level from the output of network 40 and the charge level of the capacitor 16, respectively.

Comparator 32 has two input connections, one of which receives a signal continuously applied and the other of which receives a signal applied through switch means 26 responsive to smoke detector 28. Comparator 32 thereby provides a continuous output signal when switch means 26 is inactivated and provides an output signal responsive to the two input signals applied thereto when switch means 26 is activated by smoke detector 28. In FIG. 1, the delay time set level is continuously applied to comparator 32 while the charge level of capacitor 16 is applied thereto via switch means 26. FIG. 2 shows an alternative connection wherein the charge level of capacitor 16 is continuously applied to comparator 32 while the delay time set level is selectively applied thereto by network 40 responsive to switch means 26.

Since Q7 and Q8 are of the p-channel type in the comparator means 32 of FIG. 2, current from the source 48 flows through Q8 so long as the charge level on capacitor 16 is less positive than the delay time set level because the forward bias of gate with respect to source is then greater in Q8 than in Q7. Therefore, Q7 becomes conductive when the charge level on capacitor 16 becomes more positive than the delay time set level during each frequency cycle of the oscillator 14, and the voltage drop resulting across the diode 50 exists as the output from the comparator means 32 for the remainder of each frequency cycle. As discussed previously, the delay time set level from network 40 is substantially at ground level when there is no alarm signal from the smoke detector 28. Consequently, Q7 will remain conductive to produce a constant output from the comparator means 32 when there is no alarm signal from the smoke detector 28, but will be intermittently conductive to produce a pulsating output from the comparator means 32 when there is an alarm signal from the smoke detector 28. Of course, circuitry other than that shown in FIG. 2 may be utilized as the comparator means 32 and the differential amplifier thereof may include bipolar transistors rather than the MOS/FET's Q7 and Q8.

Although the output from the comparator means 32 could be connected directly to enable one input of the gate 30 in other embodiments of the duty cycle control means, the level of this output is boosted by an amplifier 52 before being applied to gate 30 in the embodiment of FIG. 2. Within amplifier 52, the output from the comparator means 32 is connected to the base of a bipolar transistor Q9 having its main conduction path connected between ground and a current source 54. The drain-source conduction path of an FET transistor Q10 is connected between the voltage source +V and the input to gate 30, while the gate electrode of Q10 is connected at the interconnection between the main conduction path of Q9 and the current source 54. The output from the comparator means 32 renders Q10 conductive through Q9 to enable one input of gate 30 by substantially applying the voltage source +V thereat.

What I claim is:

1. In an oscillator circuit of the type wherein the charge rate of a capacitor from a current source determines the oscillation frequency, the improvement comprising:
    an additional constant current source connected to said capacitor, said additional constant current source being of a magnitude to charge said capacitor at a predetermined rate;
    switch means for controlling the flow of current to said capacitor from said additional constant current source, said switch means having an electrode at which a control signal is applied;
    means for generating the control signal of said switch means upon the detection of a condition at which the oscillation frequency is to change, the signal from said generating means being connected to said control electrode of said switch means, the frequency of the oscillator being changed in accordance with the existence of the conditions being detected; and
    wherein said additional constant current source includes a current mirror amplifier having master and slave paths, said master path being series connected to a resistor through said switch means and being rendered operative by said switch means to permit current flow in said master path, said resistor correlating the current flow in said master path with a voltage drop across said resistor, said slave path being connected to charge said capacitor and having current flow therein proportional to the voltage across said resistor.

2. The oscillator circuit combination of claim 1 wherein each said switch means includes an FET transistor having a gate electrode to which said control signal is applied and having a drain-source conduction path connected between said resistor and said master path in said current mirror amplifier associated therewith.

3. The oscillator circuit combination of claim 1 wherein said resistor is variable to adjust the magnitude of current flow in said slave path and the oscillation frequency therewith.

4. The oscillator circuit combination of claim 1 wherein each said current mirror amplifier includes FET transistors in each of said master and slave paths, each said transistor having a gate electrode and a drain-source conduction path, one side of said drain-source conduction path in each transistor being commonly connected to a D.C. voltage source, said gate electrodes of both transistors being commonly connected to the other side of said drain-source conduction path in said transistor of said master path, and the other side of said drain-source conduction path in said transistor of said slave path being connected to charge the capacitor.

5. In an oscillator circuit of the type wherein the frequency of oscillation is determined by the rate at which a capacitor is charged by a current source, at least one additional current source is connected to said capacitor, said additional current source being of such magnitude as to charge said capacitor at a predetermined rate, and switch means operatively associated with said additional current source for controlling the flow of current to said capacitor in response to a control signal applied to an electrode of said switch means, the improvement comprising:

means for generating said control signal upon the detection of a condition upon which the frequency of oscillation is to change, the control signal from said generating means being applied to the electrode of said switch means, the frequency of oscillation being changed in accordance with the condition being detected;

output means, having first and second input connections, for generating output signals having a first value when the difference between the signals at its first and second input connections is of a first polarity sense and having a second value when said difference is of a second polarity sense; and means for applying the charge level of said capacitor to the first input connection of said output means;

means for applying a delay time set level to the second input connection of said output means for making said output signal alternate between its first and second values at said frequency of oscillation; and wherein the ratio of the portion of each frequency cycle having the first value of said output signal to the portion of said frequency cycle having the second value of said output signal is substantially independent of the frequency of oscillation.

6. The oscillator circuit combination of claim 5 wherein said means for applying said delay time set level includes means responsive to said control signal for making said output signal at one of its first and second values when said condition is not detected.

7. The oscillator circuit combination of claim 6 wherein said means responsive to said control signal includes:

first and second field-effect transistors of complementary conductivity type to each other, each having gate and source and drain electrodes;

first and second resistors selectively connected serially through the drain-source conduction path of said first field-effect transistor as a voltage divider;

means for selectively connecting a first end of said voltage divider to a point of operating voltage through the drain-source conduction path of said second field-effect transistor, and for connecting the other end of said voltage divider to a point of reference potential;

means for applying voltages responsive to said control signal to the gate electrodes of said first and second field-effect transistors that condition them for conduction when said condition is detected.

8. The oscillator circuit combination of claim 5 wherein said additional current source includes means for providing a varying current when said condition is detected.

9. The oscillator circuit combination of claim 5 wherein said additional current source includes a current mirror amplifier having master and slave paths, the master path thereof being series connected to resistance means through said switch means and being rendered operative by said switch means to permit current flow in said master path, said slave path being connected to charge the capacitor and having current flow therein proportional to the voltage drop across said resistance means.

10. The oscillator circuit combination of claim 9 wherein said resistance means is variable for varying the magnitude of current flow in said slave path and the oscillation frequency therewith.

11. The oscillator circuit combination of claim 9 wherein said current mirror amplifier includes an FET transistor in its master path and an FET transistor in its slave path, each said FET transistor having a drain-source conduction path and a gate electrode, one end of the drain-source conduction path in each said FET transistor being commonly connected to a DC voltage source, the gate electrodes of both said FET transistors being commonly connected to the other end of the drain-source conduction path in said FET transistor of said master path, and the other end of the drain-source conduction path in said FET transistor of said slave path being connected to charge the capacitor.

12. The oscillator circuit combination of claim 9 wherein said switch means includes an FET transistor having a gate electrode to which said control signal is applied and having a drain-source conduction path connected between said resistance means and said master path of said current mirror amplifier.

* * * * *

UNITED STATES PATENT AND TRADEMARK OFFICE
CERTIFICATE OF CORRECTION

PATENT NO. : 4,250,464
DATED : February 10, 1981
INVENTOR(S) : Otto Heinrich Schade, Jr.

It is certified that error appears in the above—identified patent and that said Letters Patent is hereby corrected as shown below:

IN THE CLAIMS:

Column 6, Line 40     - after "wherein" delete -- each -- ;

and

Column 6, Line 51     - after "wherein" delete -- each -- .

Signed and Sealed this

Seventeenth Day of August 1982

[SEAL]

Attest:

GERALD J. MOSSINGHOFF

Attesting Officer     Commissioner of Patents and Trademarks